US009400295B2

(12) United States Patent
Li

(10) Patent No.: US 9,400,295 B2
(45) Date of Patent: Jul. 26, 2016

(54) METHOD AND DEVICES FOR NON-INTRUSIVE POWER MONITORING

(71) Applicant: QUALCOMM Incorporated, San Diego, CA (US)

(72) Inventor: Qing Li, Boulder, CO (US)

(73) Assignee: QUALCOMM Incorporated, San Diego, CA (US)

( * ) Notice: Subject to any disclaimer, the term of this patent is extended or adjusted under 35 U.S.C. 154(b) by 659 days.

(21) Appl. No.: 13/890,731

(22) Filed: May 9, 2013

(65) Prior Publication Data

US 2014/0333281 A1     Nov. 13, 2014

(51) Int. Cl.

| | |
|---|---|
| G01R 21/00 | (2006.01) |
| G05F 5/00 | (2006.01) |
| G06F 1/32 | (2006.01) |
| H02M 1/15 | (2006.01) |
| H02M 1/00 | (2006.01) |

(52) U.S. Cl.
CPC ......... *G01R 21/00* (2013.01); *G05F 5/00* (2013.01); *G06F 1/3203* (2013.01); *H02M 1/15* (2013.01); *H02M 2001/0012* (2013.01); *H02M 2001/0019* (2013.01); *Y02B 60/1217* (2013.01)

(58) Field of Classification Search
CPC ......... G01R 21/00; G05F 5/00; G06F 1/3203; H02M 1/15; H02M 2001/0012; H02M 2001/0019; Y02B 60/1217
USPC .................. 702/60, 64, 66, 75, 99, 117, 118; 323/271, 283, 284, 318; 324/76.11, 324/601, 654; 331/186
See application file for complete search history.

(56) References Cited

U.S. PATENT DOCUMENTS

| | | | |
|---|---|---|---|
| 6,583,609 B1 | 6/2003 | Pardoen | |
| 6,825,644 B2 | 11/2004 | Kernahan et al. | |
| 7,482,791 B2 | 1/2009 | Stoichita et al. | |
| 7,596,006 B1 * | 9/2009 | Granat | H02M 1/126 |
| | | | 323/224 |
| 7,880,554 B2 | 2/2011 | Raghunathan et al. | |
| 2007/0159149 A1 | 7/2007 | Bo et al. | |
| 2012/0274300 A1 | 11/2012 | Nakashima | |

FOREIGN PATENT DOCUMENTS

GB          2412972 A      10/2005

OTHER PUBLICATIONS

International Search Report and Written Opinion—PCT/US2014/037354—ISA/EPO—Nov. 10, 2014.

(Continued)

*Primary Examiner* — John H Le

(74) *Attorney, Agent, or Firm* — The Marbury Law Group, PLLC

(57) ABSTRACT

A method and device are disclosed for estimating a power demand level of an active circuit on a power supply line. A ripple amplitude and a ripple frequency associated with operation of the active circuit may be monitored on the power supply line. The ripple amplitude and ripple frequency may be compared with corresponding references. The ripple amplitude and ripple frequency may be associated with an estimated power demand level of the active circuit on the power supply line based on the comparison. A ripple generator generates a controlled ripple on the power supply line for calibration.

30 Claims, 14 Drawing Sheets

(56) References Cited

OTHER PUBLICATIONS

Lee S.J., et al., "Predictive Temperature-Aware DVFS", IEEE Transactions on Computers, IEEE Service Center, Los Alamitos, CA, US, vol. 59, No. 1, Jan. 1, 2010, pp. 127-133, XP011283085, ISSN: 0018-9340, DOI: 10.1109/TC.2009.136.
Partial International Search Report—PCT/US2014/037354—ISA/EPO—Oct. 7, 2014.

* cited by examiner

METHOD AND DEVICES FOR NON-INTRUSIVE POWER MONITORING

BACKGROUND

As modern system on chip (SoC) devices, such as those for smart phones, are becoming more integrated and powerful, and as requirements for extended battery life and smaller form factor are becoming more stringent, providing solutions to thermal, power, and battery management issues is becoming more and more challenging. The ability to monitor the power rail current enables the system to mitigate potential thermal problems, manage power usage, and solve battery current limiting issues.

However, presently, the ability to provide an efficient way to monitor rail current associated with the conventional smart phone SoC has been limited. Conventional approaches, such as using a current sensing element or managing power exclusively through a power management chip, are prohibitively expensive, not very effective, not power efficient, and/or are too intrusive which might cause reliability issues. For example, digital power meter approaches are a power prediction rather than an actual measurement, which may not always provide accurate results and cannot measure the static leakage load.

SUMMARY

Various aspects provide methods and devices for estimating a power demand level of an active circuit, which may include measuring a ripple amplitude and a ripple frequency on a power supply line coupled to the active circuit, converting the ripple amplitude and the ripple frequency into a ripple amplitude index and a ripple frequency index, and using the ripple amplitude index and the ripple frequency index to obtain an estimated power demand level of the active circuit.

In an aspect, the ripple amplitude index and the ripple frequency index may be used to obtain an estimated power demand level of the active circuit by using the indices to look up a stored value for the estimated power demand level, such as in a table lookup operation using a data table of estimated power demand levels indexed to ripple amplitude index and the ripple frequency index values. Estimated power demand levels stored in the data table of estimated power demand levels may be calculated based on an intrinsic inductance of the power supply line and an intrinsic capacitance of the active circuit established during a calibration procedure. In a further aspect, the estimated power demand level of the active circuit may be used to control a level of the power supply line, including controlling a level of the power supply line based on a peak power usage condition before a critical thermal level is reached. In a further aspect, the power supply line may be associated with a digital circuit, and measuring a ripple amplitude and a ripple frequency on a power supply line coupled to the active circuit may comprise non-intrusively measuring the ripple amplitude and the ripple frequency using an analog circuit with a high input impedance coupled to the power supply line. In a further aspect, the active circuit may include a system-on-chip (SoC) circuit.

In another aspect, a method of calibrating a power monitor circuit for estimating a power demand level of an active circuit on a power supply line, may include disabling a clock associated with the active circuit, inputting a first switching signal that may have a first lower frequency less than an intrinsic frequency of the active circuit, into a calibrated test load that may be coupled to the power supply line, and that may have a known value, using the power monitor circuit to measure a ripple amplitude and a ripple frequency on the power supply line associated with inputting the first switching signal, and calculating an intrinsic capacitance of the active circuit and an intrinsic inductance of the power supply line based on the ripple amplitude and the ripple frequency. In an aspect, a leakage current associated with the active circuit may be determined using the calibrated test load, the intrinsic capacitance and the intrinsic inductance. In an aspect, the method may include inputting a second switching signal that may have a second lower frequency than the first switching signal into the test load, measuring a line current in the power supply line; and calibrating the test load and establishing the known value of the calibrated test load using the intrinsic capacitance, the intrinsic inductance, the measured line current, and the determined leakage current. In a further aspect, the method may include inputting a plurality of switching signals that each may have representative amplitudes and representative frequencies into the calibrated test load, determining an estimated power demand level of the active circuit on the power supply line for each combination of the representative amplitudes and frequencies of the plurality of switching signals, and storing in a memory the estimated power demand level for each combination of the representative amplitudes and frequencies of the plurality of switching signals. The estimated power demand level for each combination may be stored in a lookup table in which each estimated power demand levels may be indexed to a particular combination of representative amplitudes and frequencies.

Further aspects include a power monitor circuit configured to perform the aspect method described above to estimate a power demand level of an active circuit on a power supply line. Such a power monitor circuit may include an interface having leads that may be configured to non-intrusively couple the power monitor circuit to a power supply line of the active circuit, a measurement circuit that may be coupled to the interface and may include a ripple amplitude measurement section configured to measure a ripple amplitude of the power supply line when the leads are coupled to the power supply line, and a ripple frequency measurement section that may be configured to measure a ripple frequency of the power supply line when the leads are coupled to the power supply line. The power monitor circuit may further include a conversion circuit that may be coupled to the measurement circuit and may include a ripple amplitude conversion section that may be configured to convert the ripple amplitude into a ripple amplitude index and a ripple frequency conversion section that may be configured to convert the ripple frequency into a ripple frequency index, and a memory that may be coupled to the interface the measurement circuit and the conversion circuit, the memory may store a plurality of estimated power demand levels indexed to ripple amplitude indices and ripple frequency indices. In a further aspect, the power monitor circuit may include an output circuit coupled to the memory and the conversion circuit that may be configured to use the ripple amplitude index and the ripple frequency index to obtain and output a corresponding estimate of power demand level from the memory. In a further aspect, the measurement circuit may include an analog circuit that may have a high input impedance that may be non-intrusively coupled to the interface. In a further aspect, the active circuit may include a system-on-chip (SoC) circuit. In a further aspect, the memory stores the plurality of estimated power demand levels indexed to ripple amplitude indices and ripple frequency indices in the form of a lookup table.

In a further aspect, the power monitoring circuit may include a calibration circuit that may include a calibrated test load having a known resistance value and a switch configured to connect the calibrated test load to the interface. In an aspect, the calibration circuit may be configured to control the switch to generate a first calibration signal that may have first frequency lower than an intrinsic frequency of the active circuit, on the power supply line through the test load when the leads are coupled to the power supply line and when a clock associated with operation of the active circuit is disabled. In an aspect, the power monitoring circuit may be further configured to measure a ripple amplitude and a ripple frequency associated with the first calibration signal through the calibrated test load, and calculate an intrinsic capacitance of the active circuit and an intrinsic inductance of the power supply line based on the ripple amplitude and the ripple frequency. In an aspect, the monitoring circuit may be further configured to determine a leakage current associated with the active circuit using the calibrated test load, the calculated intrinsic capacitance, and the calculated intrinsic inductance. In an aspect, the calibration circuit may be further configured to control the switch to generate a second calibration signal on the power supply line through the test load, the second calibration signal having a second frequency lower than the first frequency when the clock associated with the operation of the active circuit is disabled and the monitoring circuit may be further configured to measure a line current in the power supply line and calibrate the test load and establish the known value using the intrinsic capacitance, the calculated intrinsic inductance, the measured line current, and the determined leakage current. In an aspect, the calibration circuit may be further configured to control the switch to generate a plurality of ripple calibration signals on the power supply line through the calibrated test load and each of the plurality of ripple calibration signals may have a representative amplitude and representative frequency, and the monitoring circuit may be further configured to provide an estimated power demand level of the active circuit on the power supply line for each combination of the representative amplitudes and representative frequencies of the plurality of ripple calibration signals.

Further aspects include a power monitor circuit having means for performing the functions of the methods described above.

BRIEF DESCRIPTION OF THE DRAWINGS

The accompanying drawings, which are incorporated herein and constitute part of this specification, illustrate exemplary aspects of the invention, and together with the general description given above and the detailed description given below, serve to explain the features of the invention.

DETAILED DESCRIPTION

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

The term "computing device" is used herein to refer to any one or all of cellular telephones, smart phones, personal or mobile multi-media players, personal data assistants (PDA's), laptop computers, desktop computers, tablet computers, smart books, palm-top computers, wireless electronic mail receivers, multimedia Internet enabled cellular telephones, televisions, smart TVs, smart TV set-top buddy boxes, integrated smart TVs, streaming media players, smart cable boxes, set-top boxes, digital video recorders (DVR), digital media players, and similar personal electronic devices which include a programmable processor, especially those that include an SoC.

The various aspects address and overcome the drawbacks of current SoC power measurement methods by non-intrusively monitoring a voltage ripple on an SoC power rail in order to measure frequency and magnitude, and using the frequency and magnitude values in a calibrated lookup table to estimate the SoC power usage. Various aspects also include a self calibrating ripple monitoring module that may be used to measure intrinsic characteristics of an SoC and power management module in order to develop lookup table values for power estimation. Further aspects include methods and devices to perform self calibration of the ripple generator.

Figure 1A:
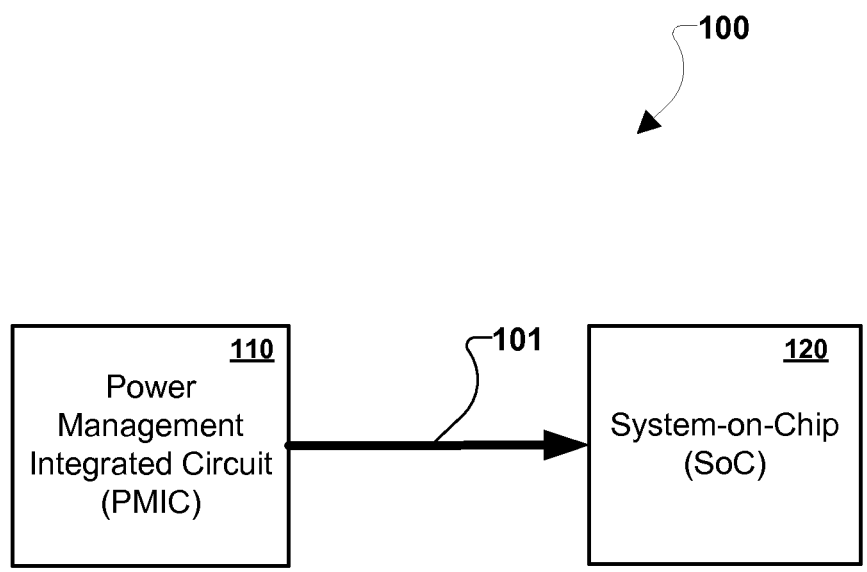
FIG. 1A is a block diagram illustrating an example power management module, power rail, and system-on-chip (SoC) module according to an aspect.
Figure 1B:
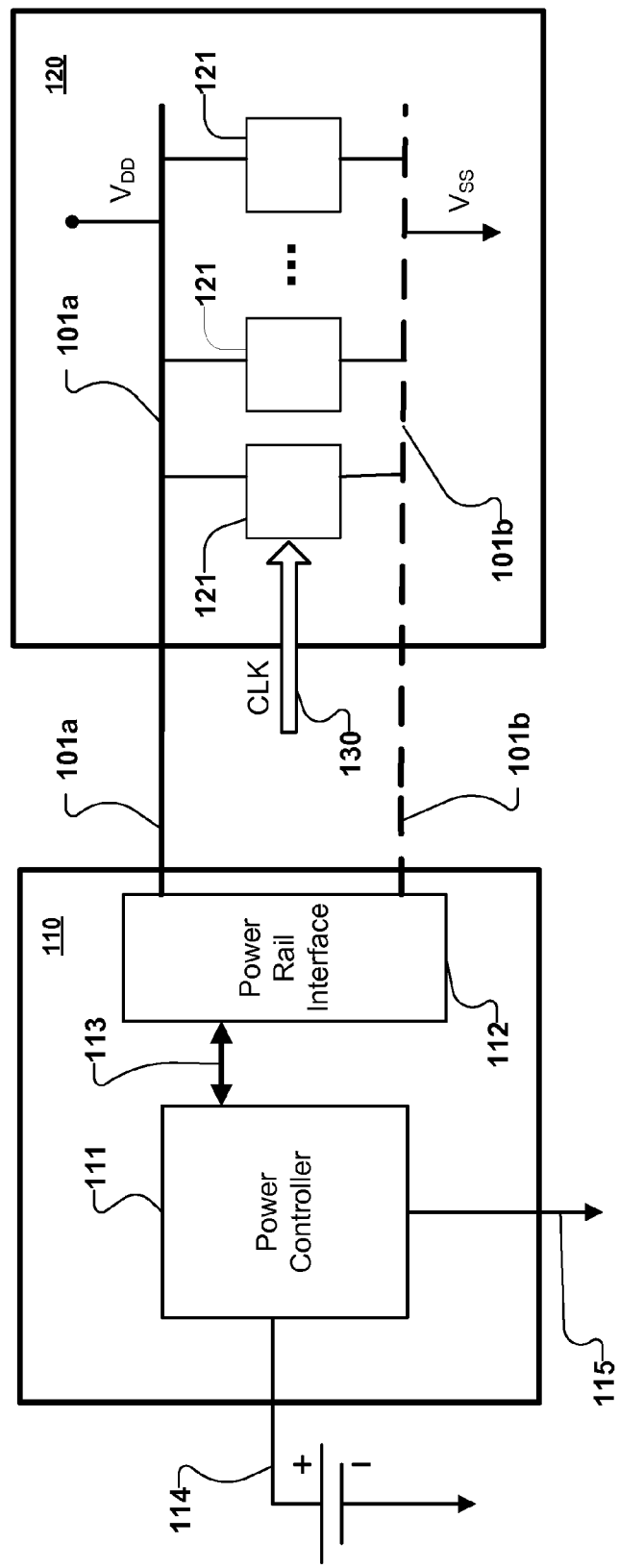
FIG. 1B is a circuit block diagram illustrating exemplary portions of a power management module, a power rail, and an SoC according to an aspect.
Figure 1C:
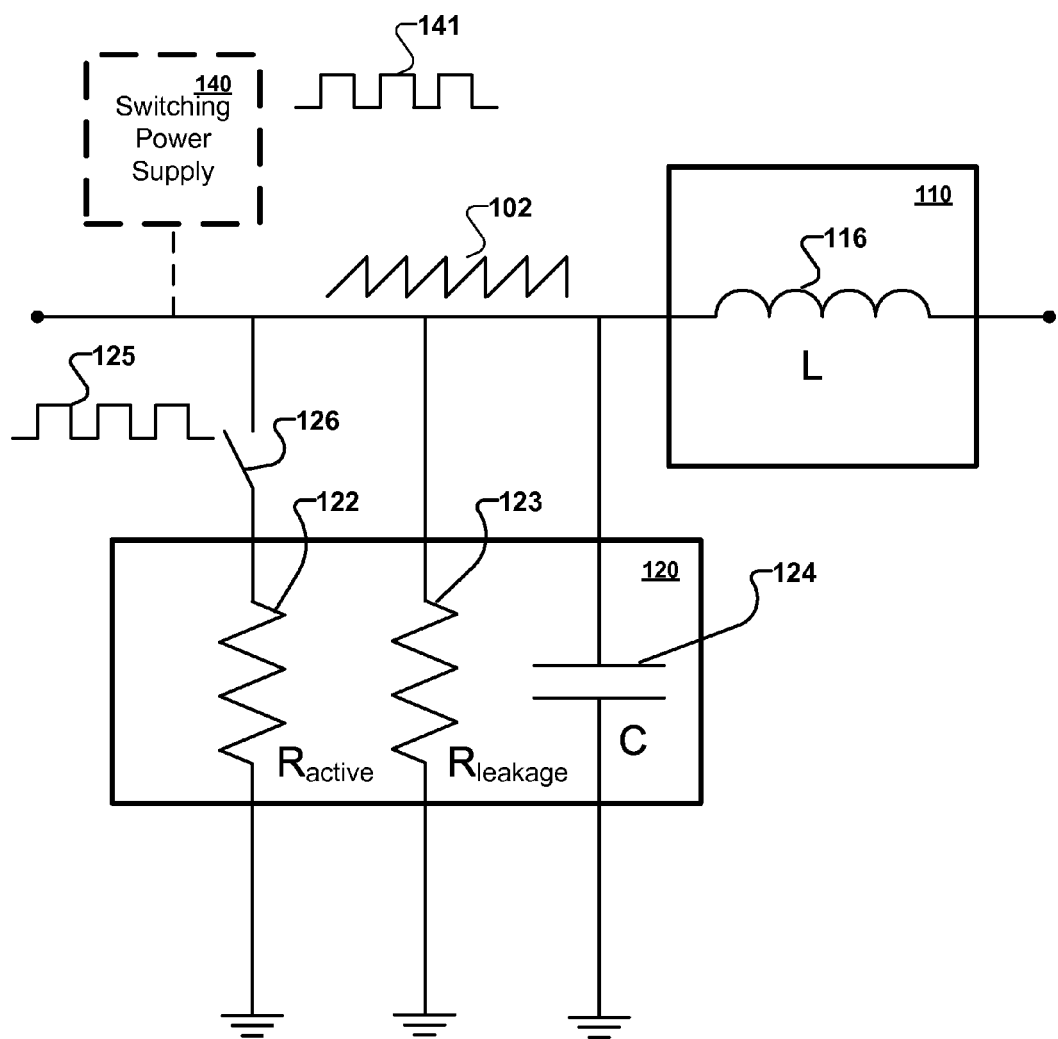
FIG. 1C is a diagram illustrating intrinsic parameters and exemplary waveforms according to an aspect.

FIGS. 1A-1C illustrate various aspects. FIG. 1A illustrates a system or a portion of a typical system 100 that includes an SoC block 120 and a power management circuit block 110 coupled to a power supply line, such as power rail 101. FIG. 1B illustrates the power management circuit block 110 that may be a typical power management IC or module for controlling aspects of power management, regulation, control, and management of a power source, such as a battery 114 or other power source. Power supplied to the SoC block 120 may be regulated by the power management circuit block 110 and the power rail 101 which may include a "positive" power rail 101*a* and a "negative" power rail 101*b*. While the power rail 101*a*, 101*b* may be described as "positive" and "negative" herein, the polarity of the power rail may depend on the manner in which the power system is designed in terms of the operating voltages and polarities. Further, while described herein as a "power rail," reference may be made to "power supply line" for generality with the same effect. However, the principles of operation of various aspects are generally the same regardless of the polarity of the power rail or power supply line. For ease of description, the ripple voltage is referred to as being generated and measured on a power rail.

For clarity, the power management circuit block 110 may contain a power rail interface 112, which may be a module for interfacing between a controller portion 111, which may be a low power digital control circuit and the power rail 101 itself. The power rail 101 may be a power supply line for supplying power in the form of regulated operating currents and voltages through a connection 113, which connection may refer to a combination of digital and/or analog control lines that provide output to and input from the power rail interface 112. Such lines may include lines for voltage and current regulation and lines for other general or specific purposes. The controller portion 111 may further provide, as an output, such as on a pin thereof, a current sense line 115 that provides a value of line current associated with a power rail 101. The current sense line 115 may be used herein in a calibration mode, to produce a measured line current as described in greater detail herein below.

The SoC block 120 may contain the positive power rail 101*a* and a ground, or the negative power rail 101*b* between which circuits 121 may be coupled. The circuits 121 may represent various digital circuits and analog circuits or hybrid circuits (e.g., analog, digital or mixed signal) that form all or part of the "system" of the system-on-chip (SoC) circuit such as SoC 120, which may also be referred to herein as an active circuit. The circuits 121 may be coupled to a clock line 130, which may be a digital clock that may be a digital signal operating directly at, at a multiple value of, or as a divided value of a main clock signal. Through the operation of the circuits 121, and possibly operation of other circuits, individual ones or the combination of which, again, may be referred to as the active circuit, ripple signals may be generated on the power rail 101. While in conventional voltage regulators, ripple from a switching power supply may be mitigated through closed loop feedback circuits, the ripple monitoring in the various aspects is used to obtain a measure of the power consumption of an active circuit during operation based upon the high frequency ripples of the operations of various transistors and switches in the circuit. For example, the various aspects can be used to monitor ripples on a power supply generated by an entire SoC 120 or individual portions of the SoC 120, such as the receiver, transmitter, modem, baseband section, or other individual parts. Also, very different from voltage regulators, no adjustments to the power supply to reduce the ripples are produced, and the various aspects may be used in systems that include a voltage regulator with a closed loop feedback as such regulators will minimize the noise from the power supply, thereby enabling the ripples from the active circuit operations to be measured more accurately.

In an aspect, an intrinsic equivalent of the SoC block 120, an intrinsic equivalent of the power management circuit block 110 and input and response waveforms are shown in FIG. 1C.

The inductance value (L) 116 and the capacitive value (C) 124 shown in the equivalent circuit may represent the intrinsic inductance of the power rail itself and the circuits of the power management circuit block 110 and the intrinsic capacitance of the circuits of the SoC 120, which may be calculated or otherwise determined or established directly or indirectly during a calibration procedure. While the intrinsic values may be calculated or determined, such determinations are unnecessary as the values may also be assumed to be constant, and thus a value that is irrelevant when power levels are determined based on calibrated responses of the system. The circuit equivalents in addition to characterizing aspects of an exemplary ripple waveform 102 such as rise time and roll-off time, may determine an intrinsic frequency ($f_r$) of the power rail. Note that switching of the logic circuits, such as the circuits 121, of the SoC block 120, at a frequency near the intrinsic frequency of the power rail will result in ripple with a particularly large amplitude. Also large power demands generated during operation of the active circuit may lead to large ripple values. The SoC 120 may be further characterized as having an active load $R_{active}$ 122 resulting in an active load current, that is, the current level at a particular switching frequency 124, which may be a rate of switching of an equivalent switch 126. The SoC 120 may further have a leakage load $R_{leakage}$. The magnitude of the switching active load and the ramp-down phase of the ripples may be used to determine the leakage current or leakage load. The system may optionally be at least partially powered by a switching power supply 140, which may be a stand-alone module or may be incorporated into the power management circuit block 110. The switching power supply 140 may be operated under control of a power supply switching signal 141, which may also contribute to the power rail ripple measurement. The power supply component of the ripple may be filtered or incorporated into power demand level estimates in aspects. However, the aspects are different from conventional power supply voltage regulation and control, which do not monitor ripple in order to estimate power demand levels of an active circuit.

By understanding and accounting for the differences in model values of the intrinsic parameters L and C from device to device for circuit blocks shown in FIG. 1C, the relationship between ripple amplitude and frequency and the power load level of the SoC 120 may be developed. Since the frequency of the ripples reflects the rate at which logic elements, or other elements in the circuits 121 of the SoC 120, are cycling and the amplitude reflects the number of element cycling at the same time or the current demands of the elements, the load of the active circuit or the SoC 120 may be determined. By measuring the quantities of ripple amplitude and frequency under operating conditions of the active circuit, the estimated load level or power demand level may be determined, for example, through a lookup table or data table, which may be populated in a calibration operation to be described in greater detail hereinafter.

Figure 2A:
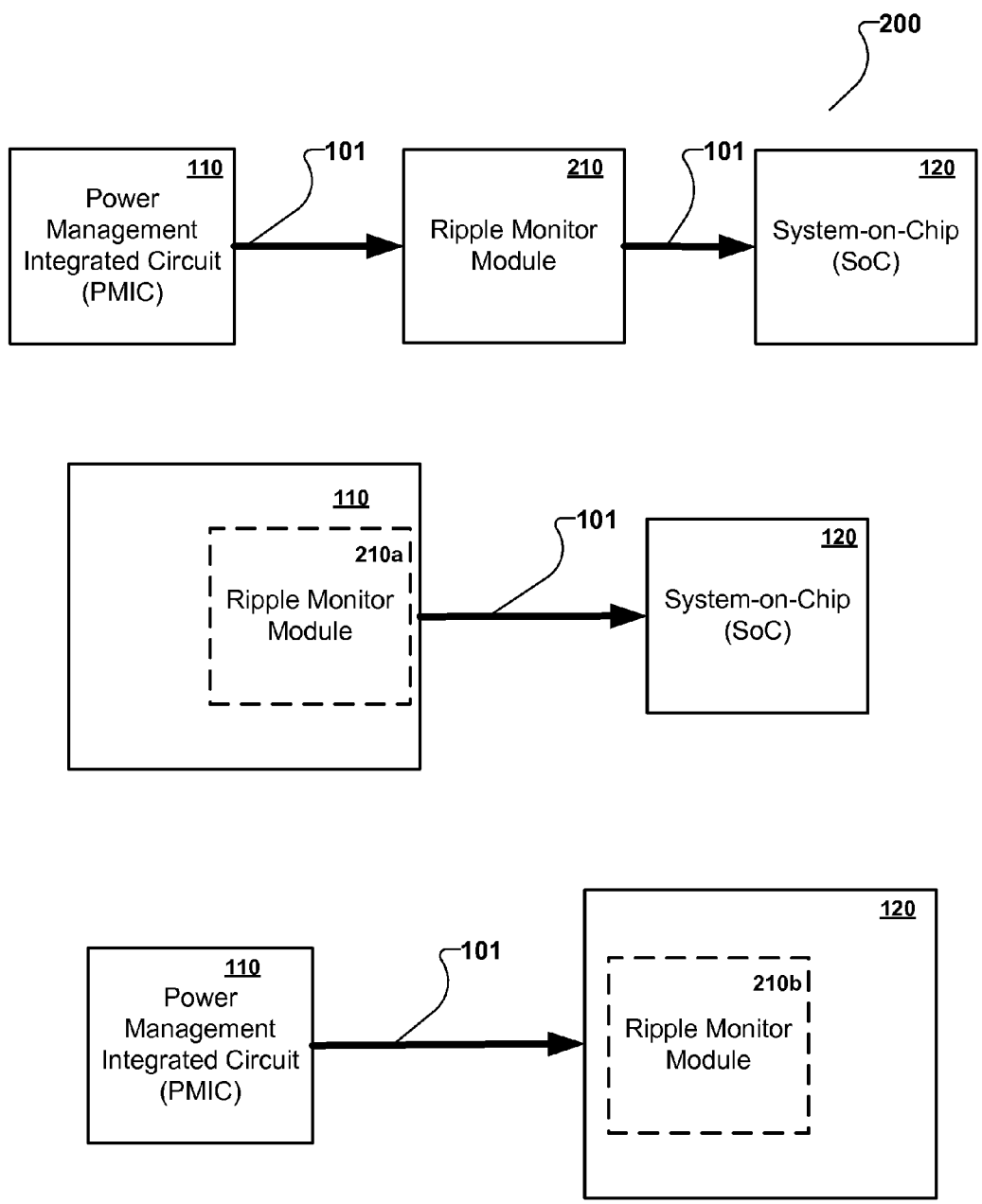
FIG. 2A is a block diagram illustrating exemplary configurations for a power rail ripple monitoring module according to an aspect.

In various aspects, a ripple monitoring module, such as the ripple monitoring module 210 shown in FIG. 2A, may be positioned in various places within a device including a power management circuit block 110, a system-on-chip (SoC) 120, and a power rail 101 and used for estimating a power demand of the device. For example, the ripple monitoring module 210 may be coupled between the power management circuit block 110 and the SoC 120 on the power rail 101. Alternatively, the ripple monitoring module 210, in an aspect as a ripple monitoring module 210*a*, may be positioned and integrated or incorporated within the power management circuit block 110 to form a power management and control module with enhanced capabilities. The ripple monitoring module may be incorporated as an added cell within the power management circuit block 110, or may be wholly incorporated into a newly designed power management circuit. The integrated ripple monitoring module 110a and the power management circuit block 110 may be coupled to the SoC 120 and the power rail 101. In another aspect, the ripple monitoring module 210, in an aspect as a ripple monitoring module 210b, may be positioned and integrated or incorporated within the SoC 120 to form an SoC with enhanced capabilities.

Further, the functionality of the ripple monitoring module 210 may be divided into at least a calibration section and a measurement or monitoring section as will be described hereinafter. The individual sections may be further distributed in various positions within an exemplary system or device, and may be coupled to the power rail and active circuit through an interface or other connection. For example, a ripple monitoring module section could be positioned, integrated or incorporated within the power management circuit block 110, and a monitoring section may be positioned, integrated, or incorporated within the SoC 120 or some combination of placements such as external placements, or partial external placements. Depending on the level and location of integration or incorporation, all or part of the ripple monitoring module may be a stand alone device or circuit and may alternatively be coupled to the power rail and/or SoC, or to a circuit board containing these components by leads including through an interface such as a connection interface or other interface.

Figure 2B:
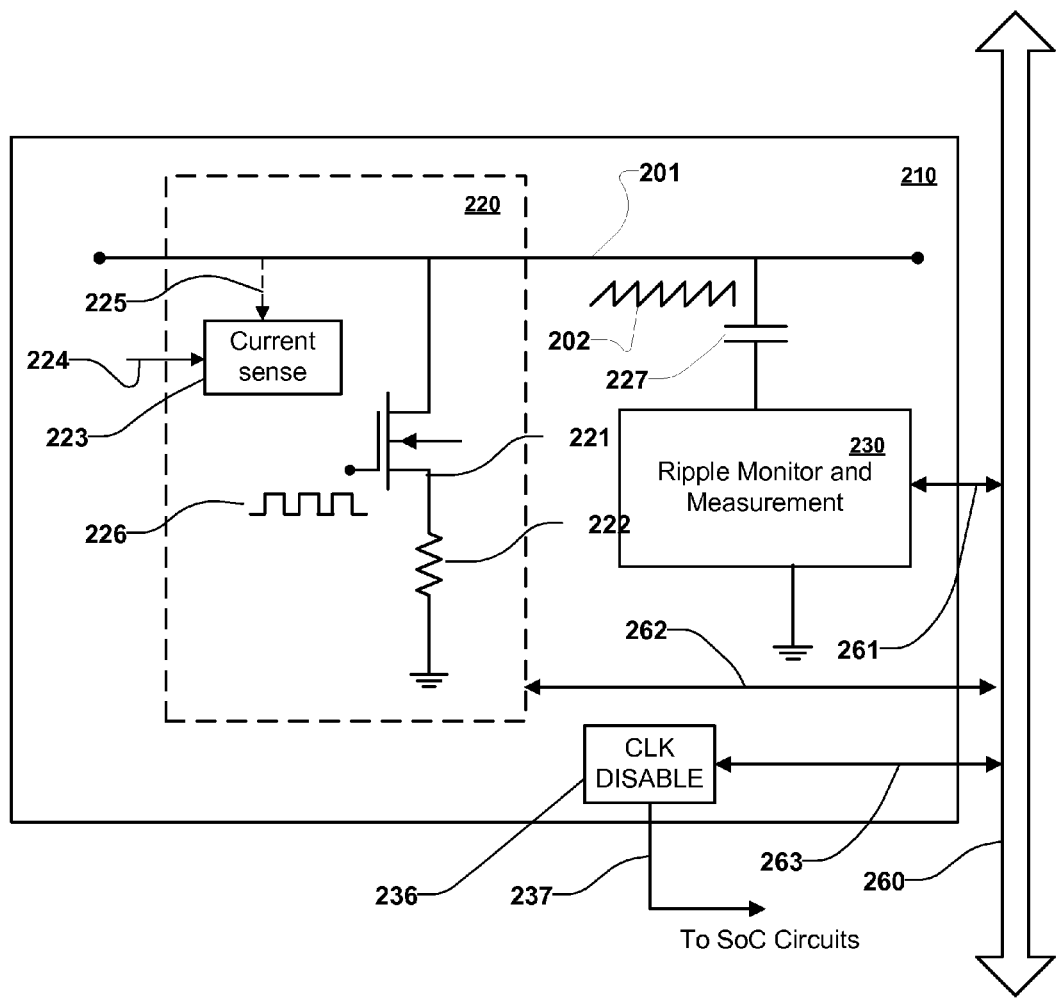
FIG. 2B is a block diagram illustrating an exemplary power rail ripple generator, ripple monitoring module, and waveforms according to an aspect.

The positioning of the ripple monitoring module 210, or portions thereof may be flexible. Therefore, the general configuration and operation is described in FIG. 2B and FIG. 2C in which the calibration, monitoring, and control portions may be configured together. As shown in greater detail in FIG. 2B, a calibration portion 220 may comprise a switch 221, which may be a transistor switch such as an n-channel MOSFET, or other switching device suitable for handling the switching current developed in the test load 222. The calibration portion may be coupled to the power rail and active circuit through an interface or other coupling device. During calibration, a first calibration signal or a first switching signal, such as a switching signal 226, may be generated and applied to the switch 221 to develop a controlled ripple signal 202 on the power rail 201. Various modes of operation of the calibration portion 220 will be described in greater detail hereinafter. The calibration portion 220 may further be coupled to a bus 260, which may include bi-directional data lines, bi-directional control lines, other lines, or a combination thereof, that may be common to the device or system into which the calibration portion 220, and possibly other portions may be integrated.

The calibration portion 220 may be coupled to the bus 260 through a connection 262, which may include all or a portion, or some combination of the data lines, control lines, or other lines that may be available on the bus 260. The calibration portion may also include a current sense module 223 that may sense current in the power rail 201 through a connection 225, such as a series connection with the power rail, or may receive an external current sense signal 224, which may be provided from a conventional power management module to provide a measured line current. It should be noted that the ability to selectively sense current may be required for the calibration of the test load 222, and such sensing may form part of a procedure to be described in greater detail hereinafter. Also, in order to further provide non-intrusive monitoring, the current sense module 223 in the calibration portion 220 may be disabled during operation of the monitoring so as to provide a greater degree of accuracy of power measurements and achieve non-intrusiveness. Also, while the current sense module 223 may be coupled in series with the power rail in order to obtain an accurate reading of current on the power rail, other connection configurations may be possible.

Figure 2C:
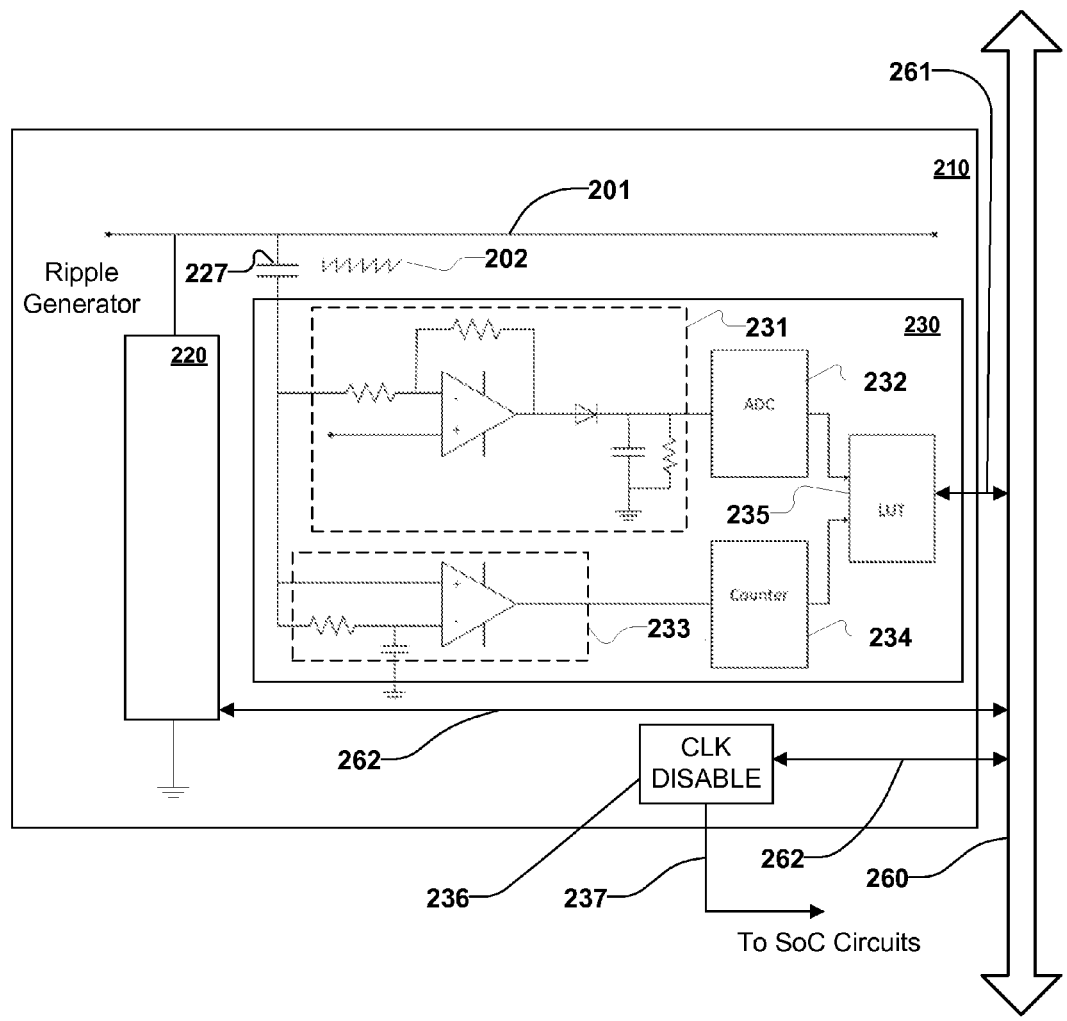
FIG. 2C is a diagram illustrating an exemplary ripple monitor, power rail ripple monitoring module, and waveforms according to an aspect.

In an aspect, in addition to the calibration portion 220, a measurement circuit or monitoring circuit, such as a ripple monitor and measurement portion 230, is shown in greater detail in FIG. 2C. To provide decoupling and current isolation, a capacitor 227 may be placed between the power rail 201 and the ripple monitoring and measurement portion 230. The power rail ripple 202, which may be a controlled ripple generated by the calibration section 220 during calibration or operational ripples generated during operation by the activity of the circuits of the SoC 120, may be input to a ripple amplitude measurement section 231 and a ripple frequency measurement section 233.

The ripple amplitude measurement section 231 may include an active component such as an operational amplifier with a reference input and active input, passive feedback components and other active and passive components to provide a measured ripple amplitude signal to a ripple amplitude conversion section or circuit, such as an analog to digital converter 232, which may convert the measured ripple amplitude. The output of the analog to digital converter 232 may provide a digital value associated with the ripple amplitude or magnitude that may be used as at least a first index into a lookup table or data table, such as the lookup table 235, which may be stored in a memory and represent stored values that can be accessed according to an index or address into the memory.

The ripple frequency measurement section 233 may include a ripple frequency conversion section or circuit, an active component such as an operational amplifier and passive components configured to act as a pulse generator to provide a measured input, representing the ripple frequency, to a counter 234, which may convert the measured ripple frequency. The output of the counter 234 may provide a digital value associated with the measured ripple frequency that may be used as at least a second index into the lookup table 235.

The conversion circuits for the ripple amplitude and ripple frequency may also be combined in a conversion circuit that performs amplitude and frequency conversion.

The combination of outputs from the analog to digital converter 232 and the counter 234 may provide a partial or complete index into the lookup table 235 where an estimated power demand level or value may be stored for combinations of ripple frequencies and amplitudes that may be developed during calibration procedures to be described in greater detail hereinafter. The ripple amplitude and frequency indexes may be used to directly access a stored value such as an estimated power demand level value stored in the lookup table 235 or may be compared with a reference value to generate an actual index for lookup or to associate the ripple amplitude index and the ripple frequency index with an estimated power demand level value for the active circuit. Alternatively, the conversion elements, such as the analog to digital converter 232 and the counter 234, may be configured and matched to the system such that the conversion resolution takes into account desired accuracy of the measured quantities and can be used for generating indexes, which may be input into and provide direct access into the lookup table 235.

In an aspect, the lookup table 235 may be coupled to the bus 260 through a connection 261, which may include all or a portion of the data lines, control lines, or other lines that may be available on the data bus 260. Through the connection 261, the lookup table 235 may be monitored and possibly modified for initialization purposes, as improved information becomes available regarding the correlation between ripple amplitude values and frequencies, and estimated power demand levels, or under other circumstances. A clock disable module 230 may also be provided that may generate a clock disable signal 237 that may be used to disable the active circuits such as the circuits 121 and possibly other circuit as needed during a calibration procedure. The clock disable module 230 may also be coupled to the bus 260 through a connection 262, which may include all or a portion of data lines, control lines, or other lines that may be available on the data bus 260.

Figure 2D:
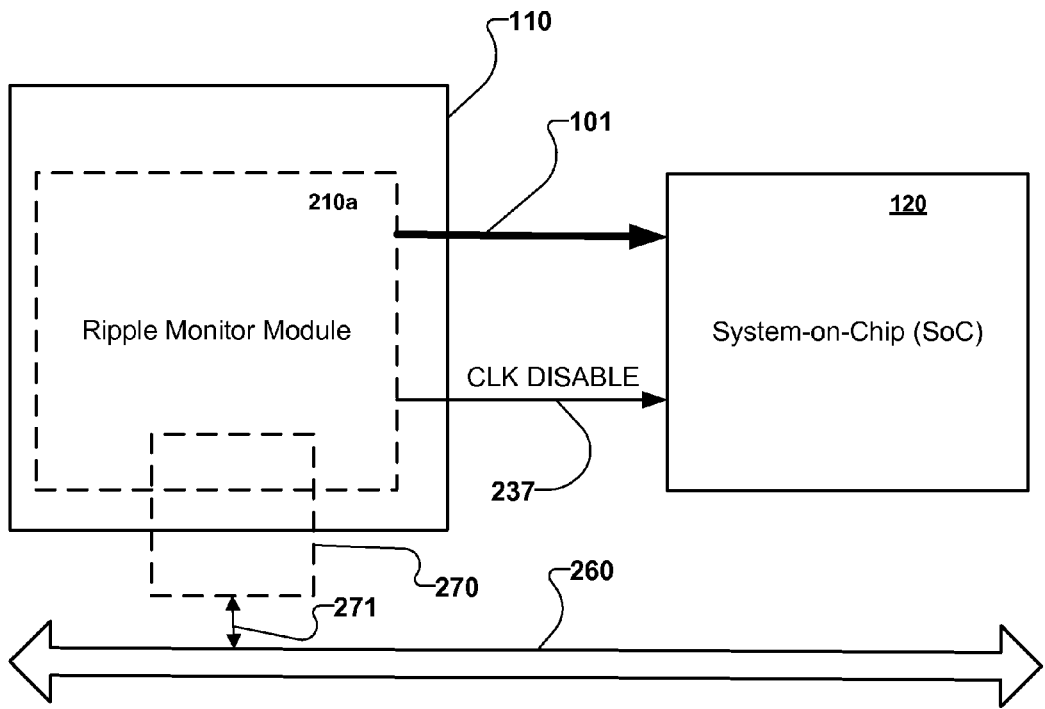
FIGS. 2D and 2E are diagrams diagram further illustrating exemplary configurations for a power rail ripple monitoring module with clock disable according to an aspect.
Figure 2E:
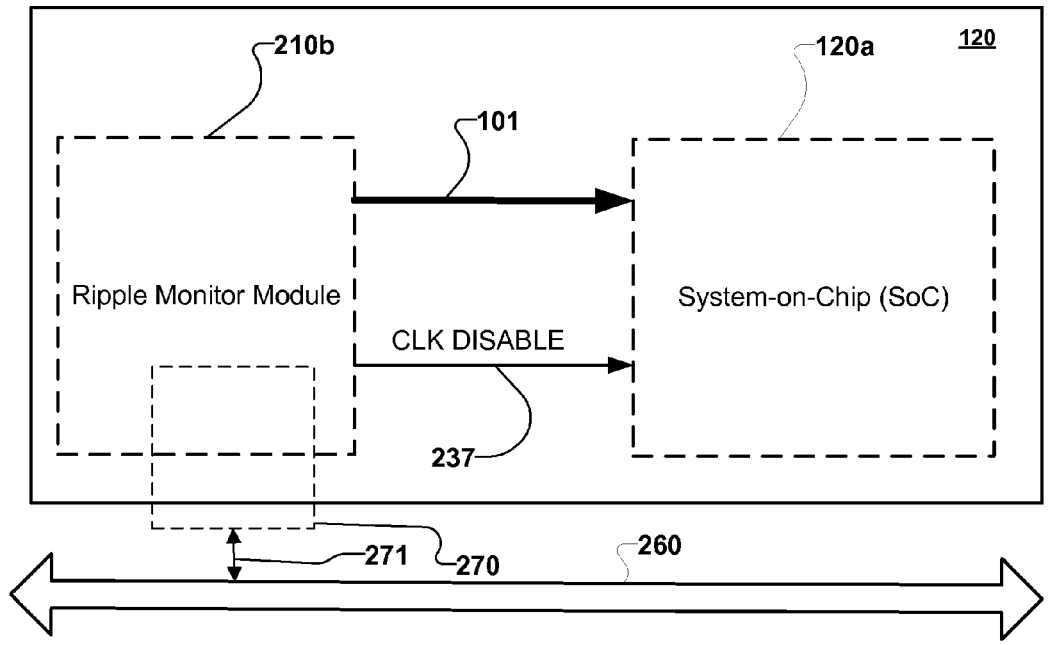

For the various placements of an exemplary ripple monitoring module 210, including those shown for example, in connection with FIG. 2D, a controller 270 may be incorporated into the ripple monitoring module and coupled to the bus 260 through a connection 271. The controller may be a processor, logic circuit, or other circuit capable of executing control functions and operations, including a memory, and may be dedicated to independently control the operation of the ripple generator, monitor, and control portions. The controller 270 may also work in connection with a main processor (not shown) and memory coupled to the bus 260 to perform various procedures as discussed herein. The procedures may alternatively be implemented in a main processor including memory without using a dedicated controller 270.

Figure 3A:
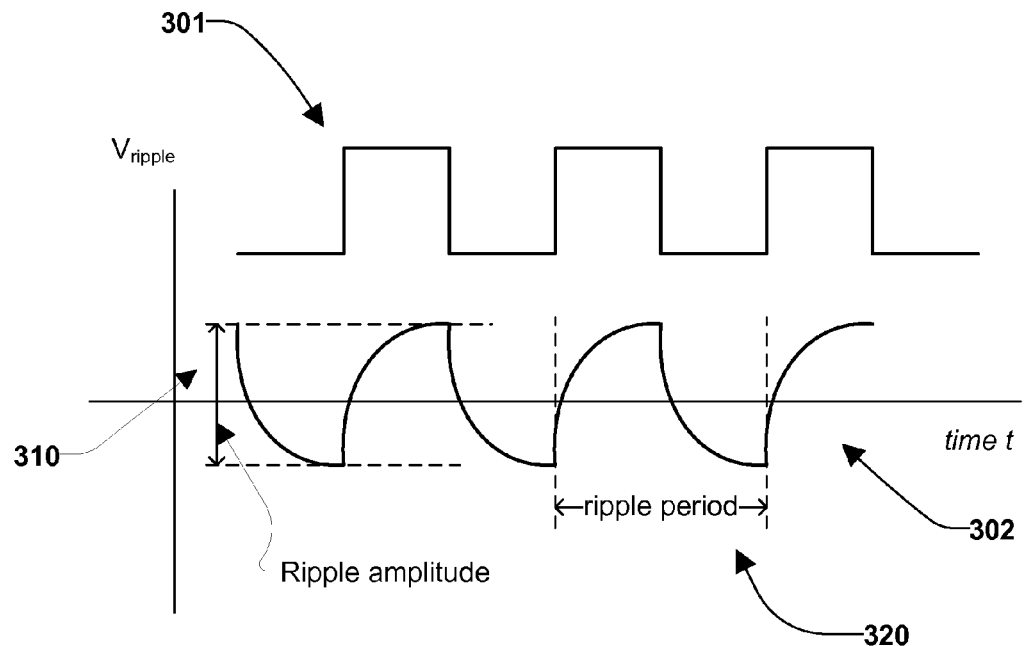
FIG. 3A is a graph illustrating an exemplary power rail ripple switching waveform and switching waveform according to an aspect.
Figure 3B:
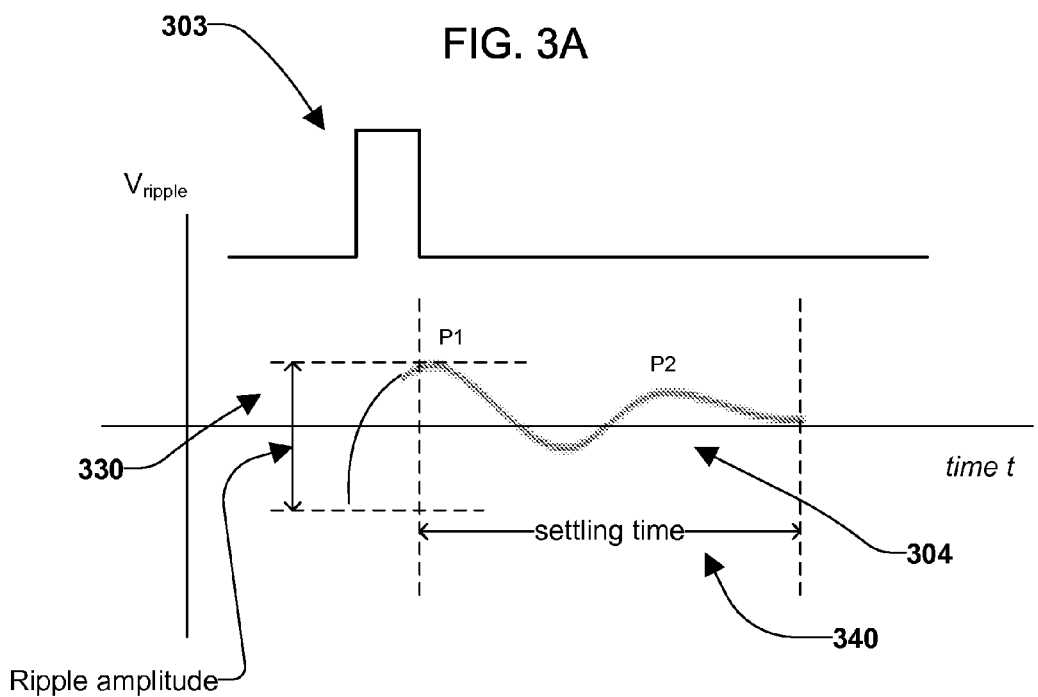
FIG. 3B is a graph illustrating an exemplary power rail ripple single pulse waveform and switching waveform according to an aspect.

The calibration procedure, in which a controlled ripple may be generated, and active operation of the SoC 120 and the power management circuit 110 disabled, facilitates monitoring various characteristics of the ripple signal on the power rail as shown in FIG. 3A and FIG. 3B. FIG. 3A shows an exemplary ripple signal 302 that may result from switching according to a second calibration signal or second switching signal such as a switching signal 301. The characteristics of the ripple amplitude 310 and the ripple frequency as a function of the ripple period 320 may be observed and measured. The shape of the ripple signal may also be indicative of the intrinsic values of the powered circuits and supply circuits such as the intrinsic capacitance C of an active circuit such as an SoC and the intrinsic inductance L of the power rail, which can be calculated from other measured factors. In FIG. 3B, a signal 304 is shown with an amplitude 330 and a settling time 340. The signal 304 may be a narrow pulse that approximates an impulse or may be a rising edge signal or a falling edge signal sufficient to generate a transient or impulse response in the active circuit. The combination of the amplitude 330 and the settling time 340 may be instructive as to the leakage load of the SoC 120. In particular, the leakage load may be determined based on the well known relationship between a factor Q, the leakage load R, and the intrinsic inductance and capacitance shown in EQ(1):

$$Q = R * \sqrt{C/L} \qquad \text{EQ(1)}$$

The factor Q represents the number of periods for the decay of an impulse response of the resonator circuit that is characterized by the leakage load R and the intrinsic values to reach 96% decay or −27 dB from the original signal level at the time a transient is applied. By solving for R, once the value for Q has been established working backwards from the transfer function of the resonator circuit according to known expressions that relate Q to the impulse response of the resonator circuit, once the decay or settling time 340 has been determined the leakage load may be calculated. Alternatively, given that the ripple decays exponentially with time according to EQ(2):

$$\text{ripple decay} = e^{(-ht)} \qquad \text{EQ(2)}$$

and that R, L and C may be related to according to the following equations EQ(3)-EQ(6):

$$h = \frac{1}{2RC} \qquad \text{EQ (3)}$$

$$\ln(r) = \left(\frac{\pi}{R}\right) * \sqrt{\left(\frac{L}{C}\right)} \qquad \text{EQ (4)}$$

$$R = [\pi/\ln(r)] * \sqrt{\left(\frac{L}{C}\right)} \qquad \text{EQ (5)}$$

$$R = A/\ln(r) \qquad \text{EQ (6)}$$

where $$A = \pi \sqrt{\left(\frac{L}{C}\right)}.$$

The unknown leakage load $R_L$ may be calculated using a known value for the test load $R_t$. With $R_t$ switched in, such as during a calibration time, $r_n = V_{peak1}/V_{peak2}$ may be measured, where $r = V_{peak1}/V_{peak2}$ (e.g., peak1 and peak2 are the first two maxima of impulse response signal 304). With the test load switched in, the relation $R = R_t * R_L/(R_t + R_L)$ may be true. With $R_t$ switched out, $r_f = V_{peak1}/V_{peak2}$ may be measured. With the test load switched out, the relation $R = R_L$ may be true. The value A in EQ(6) above may be further represented as $A = R_t * [\ln(r_n) - \ln(r_f)]$ and $R_L$ may be represented as $R_L = Rt * [\ln(r_n) - \ln(r_f)]/\ln(r_n)$. Thus, with the value for $r_n$ measured and the value for $R_t$ known, the leakage load $R_L$ may be determined by measuring $r_f$.

Calibration and monitoring may be carried out with the various circuits described hereinabove, which may form structure for various means to accomplish such functions. In addition to the circuits described herein, various methods of calibration and monitoring may be encompassed by additional aspects.

Figure 4A:
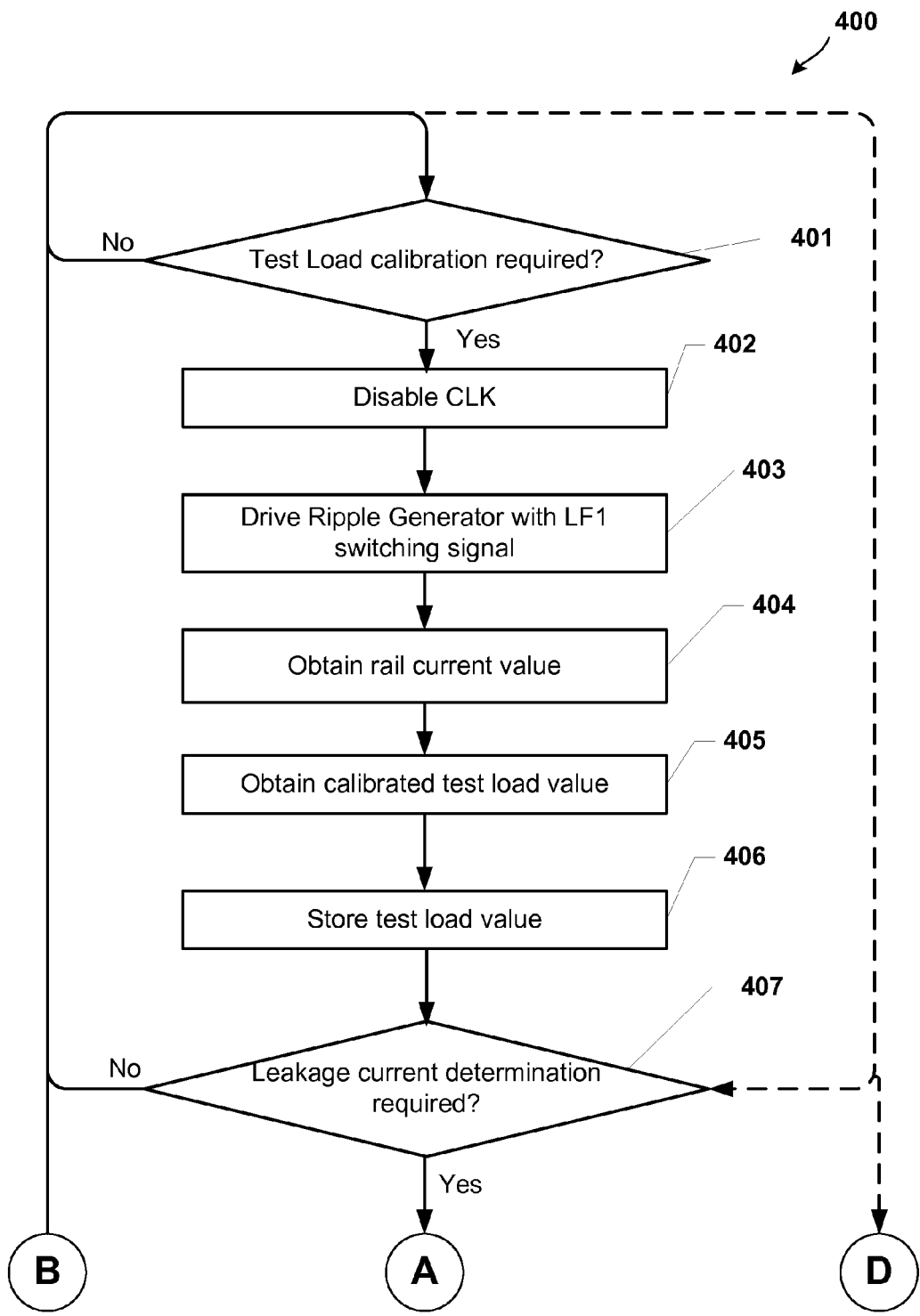
FIG. 4A is a process flow diagram illustrating an aspect method for calibration.

In FIG. 4A a method of calibrating, such as a method 400 may be performed in an aspect. An initialization or other preliminary sequence is conducted, in a determination block 401, and the device may determine whether the calibration of a test load may be required. When calibration of the test load is required (e.g., determination block 401="YES"), the clock may be disabled in block 402, which may de-activate any logic circuits or other active circuits that would draw current from the power rail. When the test load does not require calibration (e.g., determination block 401="NO"), the device may either loop until calibration is required or may proceed to 407. Alternatively, the clock may be enabled, and the device may proceed to another operation, with the ability to return to calibration processing as required.

Upon disabling the clock, the ripple generator may be driven with a switching signal at a first frequency, such as a first lower frequency, LF1, less than the intrinsic frequency, $f_r$ of the power rail in block 403. Driving the ripple generator at frequency LF1, a controlled ripple may be generated on the power rail through the test load. In order to calibrate the test load to establish a known value, the current through the test load should be known. Since the active circuits are switched off, the test load current should also be the current through the power rail. Accordingly, the rail current may be measured in block 404. The rail current may be measured through a current sensing module that forms part of the ripple generator monitor and control block or may be obtained from a current sense output of a power management circuit, as described hereinabove. The current value is obtained, and a calibrated value for the test load may be obtained in block 405. The test load value may be used to ensure the accuracy of additional measurements and is therefore stored in block 406 in a memory. Calibration of the test load may be completed, and in determination block 407, the device may check whether determination of the leakage current may be required. When a determination of the leakage current is required (e.g., determination block 407="YES"), the procedure may continue at the continuation point "A" to FIG. 4B, in which a check for whether the clock has been disabled may be conducted, and, when not disabled, a clock disable may be performed in block 408. When determination of the leakage current is not required (e.g., determination block 407="NO"), the device may loop back to 401, or may loop back to 407 until leakage determination is required. Alternatively, the clock may be enabled, and the device may proceed to another operation with the ability to return to leakage determination as required.

The clock is disabled or checked and confirmed to be disabled, and the ripple generator may be driven with a switching signal at a second frequency, such as a second lower frequency, LF2, that is lower than the intrinsic frequency, $f_r$, of the power rail, and higher than LF1, in block 409. Driving the ripple generator at frequency LF2, a controlled ripple may be generated on the power rail in block 410. The amplitude of the ripple may be measured in block 411, and may be used for determining the leakage current in block 412. The determined leakage current may be stored in block 413 in a memory for use during processing. The leakage current is stored, and in determination block 414 it may be determined whether system calibration may be required. When system calibration is required (e.g., determination block 414="YES"), the procedure may continue at continuation point "C" to FIG. 4C, in which a check may be performed whether the clock is disabled in block 415. When system calibration is not required (e.g., determination block 414="NO"), the device may loop back to "B" and continue to FIG. 4A and to 401, or may loop back through "D" to 414 until system calibration is required. Alternatively, the clock may be enabled, and the device may proceed to another operation with the ability to return to system calibration as required.

The clock is disabled or checked and confirmed to be disabled, and the ripple generator may be driven with a switching signal at a test frequency $HF_n$, which may be a frequency at or near a frequency representative of the operational frequency of the active circuits, such as the circuits of an SoC coupled to an exemplary power rail. A plurality of switching signals may be generated as $HF_n$ is iterated during the procedure. The switching signal may be generated through the calibrated test load and thus will result in a controlled ripple being generated on the power rail in block 417. The ripple amplitude and frequency may be measured in block 418 through a non-intrusive circuit including a high input impedance circuit including high input impedance elements such as operational amplifiers or other circuits that may be capacitively coupled to and present a high input impedance to the power rail thereby providing the ability to interface non-intrusively to the power rail and the active circuit. It may also be possible to couple inductively to the power rail and the active circuit in some aspects. By non-intrusively interfacing or coupling, characteristics of the monitoring circuit play little or no role in the character of the measured quantities providing a more accurate measurement.

Phase characteristics and other parameters, such as the frequency and amplitude of the ripple may be used to characterize the power demands in view of the intrinsic values for the power rail and active circuits in block 419 using characteristics associated with the measured ripple amplitude and ripple frequency. For $HF_n$, the estimated power demand level value $P_{est}$ may be calculated or otherwise determined based on the intrinsic inductance and capacitance values, and other parameters such as the leakage current and test load value in block 420. The estimated power demand level value $P_{est}$ may be stored for the corresponding ripple amplitude and value of $HF_n$ in a lookup table in block 421. The value for $HF_n$ may be iterated in block 422 and a plurality of estimated power demand levels $P_{est}$ may be generated for respective values of a plurality of ripple calibration signals, such as switching signals $HF_n$ by repeating step 421 for all values of $HF_n$ and the lookup table, which may be stored in a memory, may be populated with a plurality of estimated power demand levels $P_{est}$ for a series of representative amplitudes and representative frequencies. The calibration may be completed in block 423, and the lookup table populated. The lookup table may be modified and values changed from time to time, and in addition the calibration procedure may be invoked at any time when calibration is required.

Figure 4B:
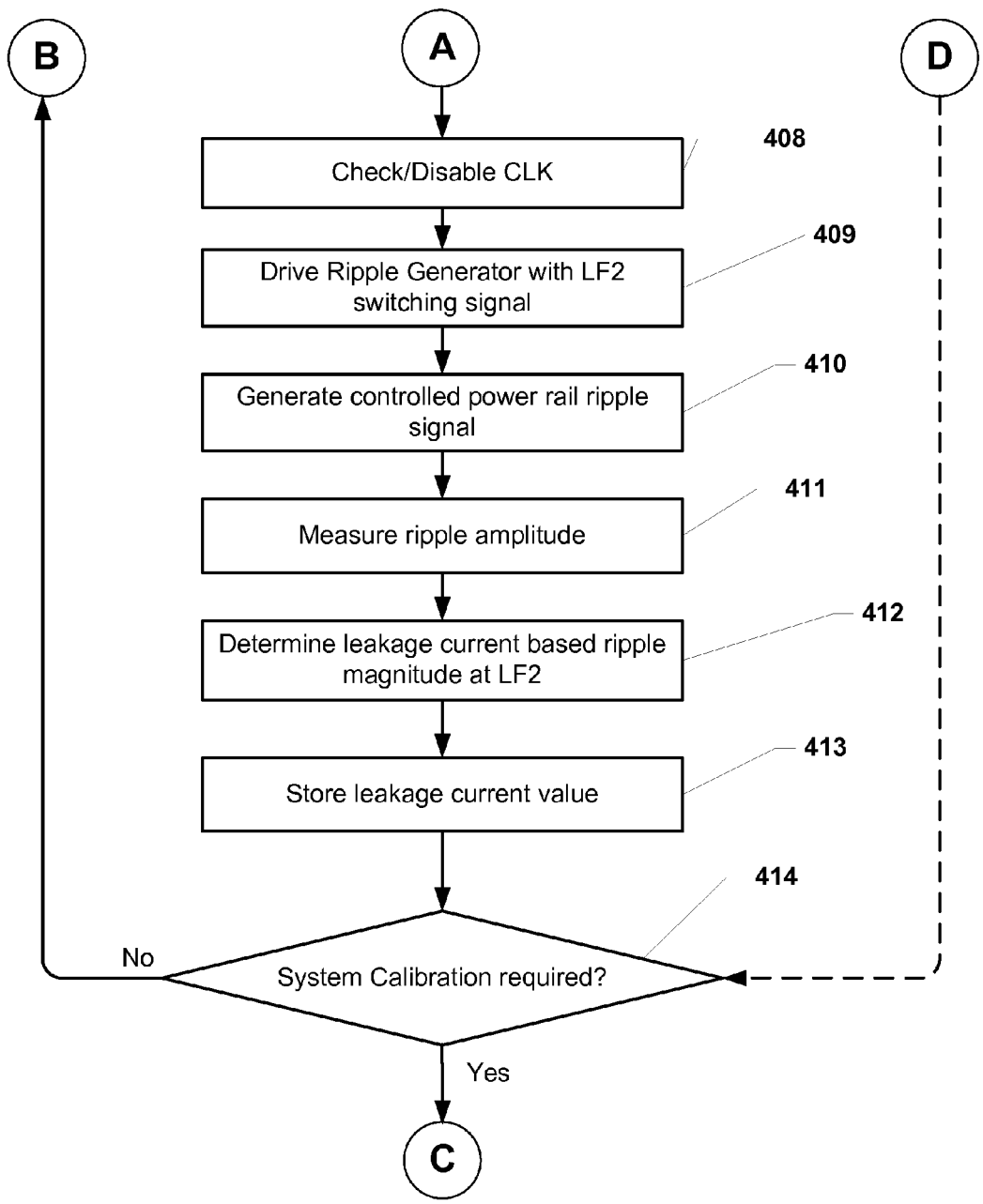
FIG. 4B is a process flow diagram illustrating an aspect method for further calibration.
Figure 4C:
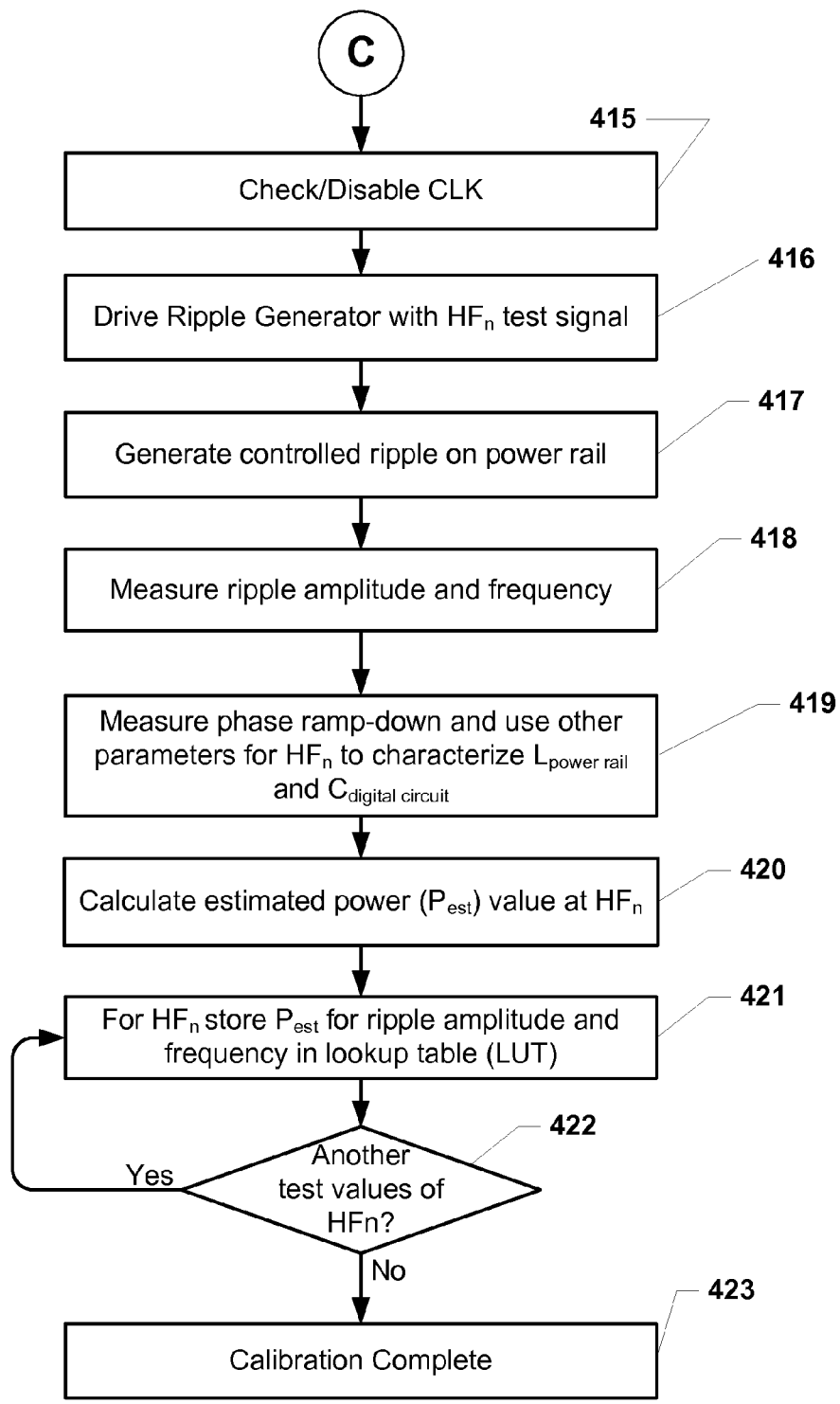
FIG. 4C is a process flow diagram illustrating an aspect method for characterizing a power rail load circuit.
Figure 5:
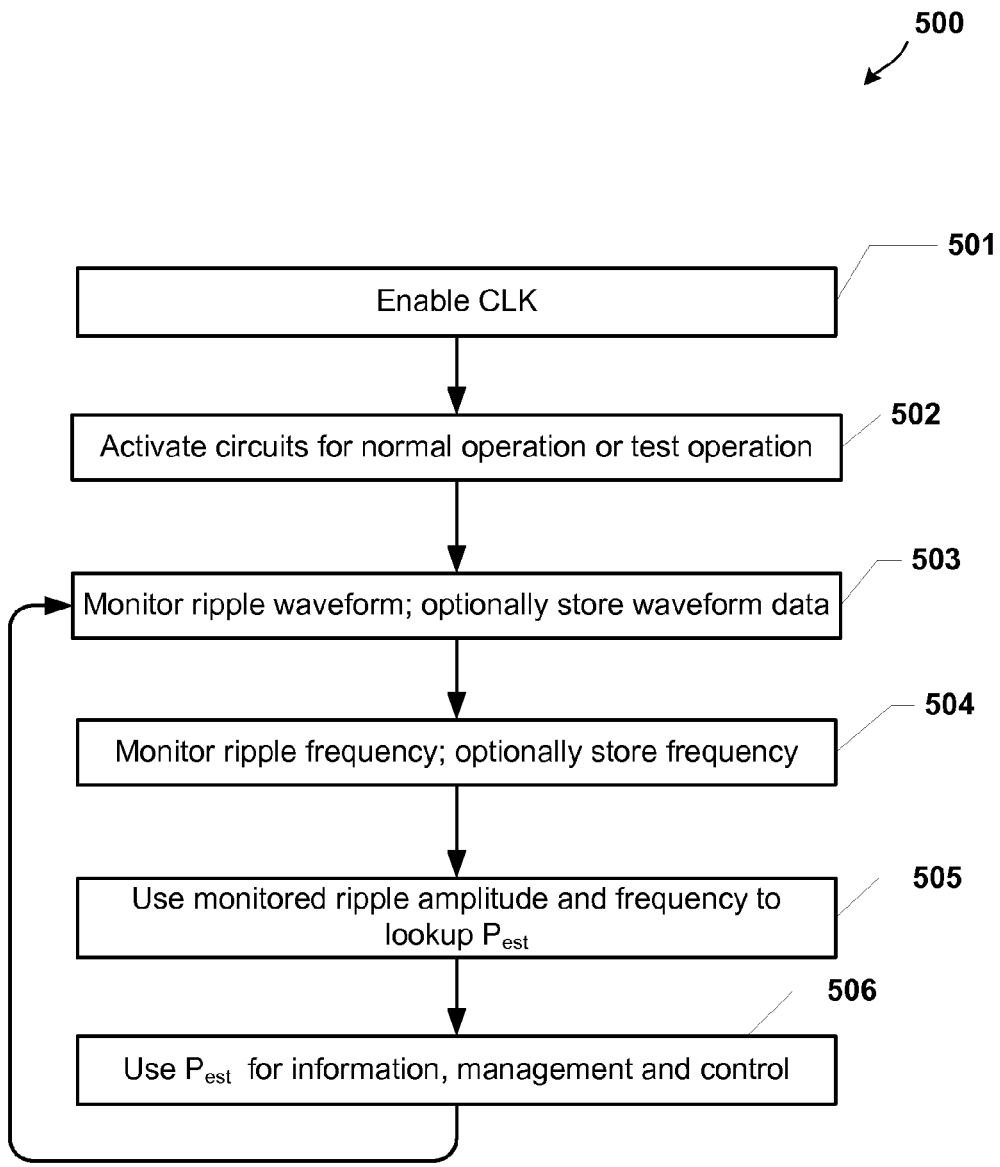
FIG. 5 is a process flow diagram illustrating an aspect method for monitoring ripple waveform characteristics and obtaining a rail power estimate.

Calibration may be completed in connection with the procedures discussed above in a method for calibrating, or methods for calibrating, as shown in FIG. 4A, FIG. 4B, and FIG. 4C, and a method of estimating may be conducted in method 500 in an aspect. The clock is enabled in block 501, and circuits of the active circuit, may be activated in block 502 for normal operation or test operation. For example, a device may be configured to operate as normal, with the logic circuits of the SoC operating to allow the device to perform usual functions in the usual manner. Alternatively, the device may be configured to operate through the logic circuits in a test mode that may allow power usage of all or certain portions of the SoC to be evaluated and the power usage estimates to be established, updated or refined. With the circuits activated, the uncontrolled ripple waveform, and in particular the ripple amplitude, may be monitored in block 503, and data associated with the waveform may be optionally stored for analysis or other purposes. The ripple frequency may be monitored in block 504, and ripple frequency data may also be optionally stored. While monitoring the ripple amplitude and frequency may be described separately herein, the ripple amplitude and frequency may be monitored separately or simultaneously in various aspects.

The monitored ripple amplitude and frequency may be used to look up the estimated power $P_{est}$ in block 505 for the current operating conditions as a function of the monitored ripple. In particular, the measured ripple amplitude and ripple frequency may be converted for associating the ripple amplitude index and ripple frequency index with an estimated power demand level of the active circuit. In an aspect method power demand level estimates may be obtained by inputting the ripple amplitude index and the ripple frequency index into a lookup table. In other words, the converted digital values for ripple amplitude and frequency may be used as an index into the lookup table to provide a power demand level estimate $P_{est}$ value, which may be an estimated power demand level for the active circuit, for the particular combination of measured amplitude and frequency values. The estimated power demand level, $P_{est}$ may be used as information to provide refinements to power management and may be used to control the actual power levels delivered to the SoC to improve efficiency, and thus extend battery life. For example, the ripple values and corresponding estimated power demand levels may indicate that a lower power level may be supplied to the SoC to minimize power usage while providing the acceptable minimum power levels for proper operation. In this way, the aspects described herein may be used to sustain optimum operation for the device, while prolonging battery life, for example. Note that the ideal operating or performance levels for the active circuit that minimize power usage may be associated with or indicated by a substantially non-zero value of the ripple amplitude, while a relatively low ripple value may indicate that the power rail supply levels are too high. Accordingly, unlike prior art systems that attempt to reduce or eliminate ripple, aspects herein use ripple advantageously to provide a controlled power level at the power rail for reducing excess power usage by monitoring ripple non-intrusively and estimating power demand levels.

The estimated power demand levels of the active circuit to may be used various purposes such as to control or limit a level of the power supply line, such as a voltage supply level or current supply level, while maintaining a predetermined performance level of the active circuit. The predetermined performance level may be a minimum performance level that satisfies minimum operational requirements, or a performance level that satisfies a specific operational condition. The estimated power demand levels may be used to determine and manage thermal factors. During peak demand intervals, the estimated power usage as obtained from the monitored ripple amplitude and frequency may indicate the degree or rate at which thermal energy will build in the active circuit. Understanding the relationship between operation of the circuit and the corresponding thermal factors may be useful in preventing an electro-thermal buckle conduction where elements, including electrical and structural elements of the SoC and other system components (e.g., a battery supply) may fail. Buckle and associated failure may occur rapidly during peak current demands and accompanying thermal increases and must be responded to rapidly, such as within 1 μs. In this manner, the various aspects may provide for an extremely rapid response to changing load conditions so as to immediately identify estimated power demand levels associated with rapid thermal escalation conditions and limit the current or power provided by the power rail to prevent thermal buckle or other undesirable effects. The estimated power demand levels may further be used to identify factors such as estimated battery life remaining, which may be useful to a user of a system that implements aspects.

Figure 6:
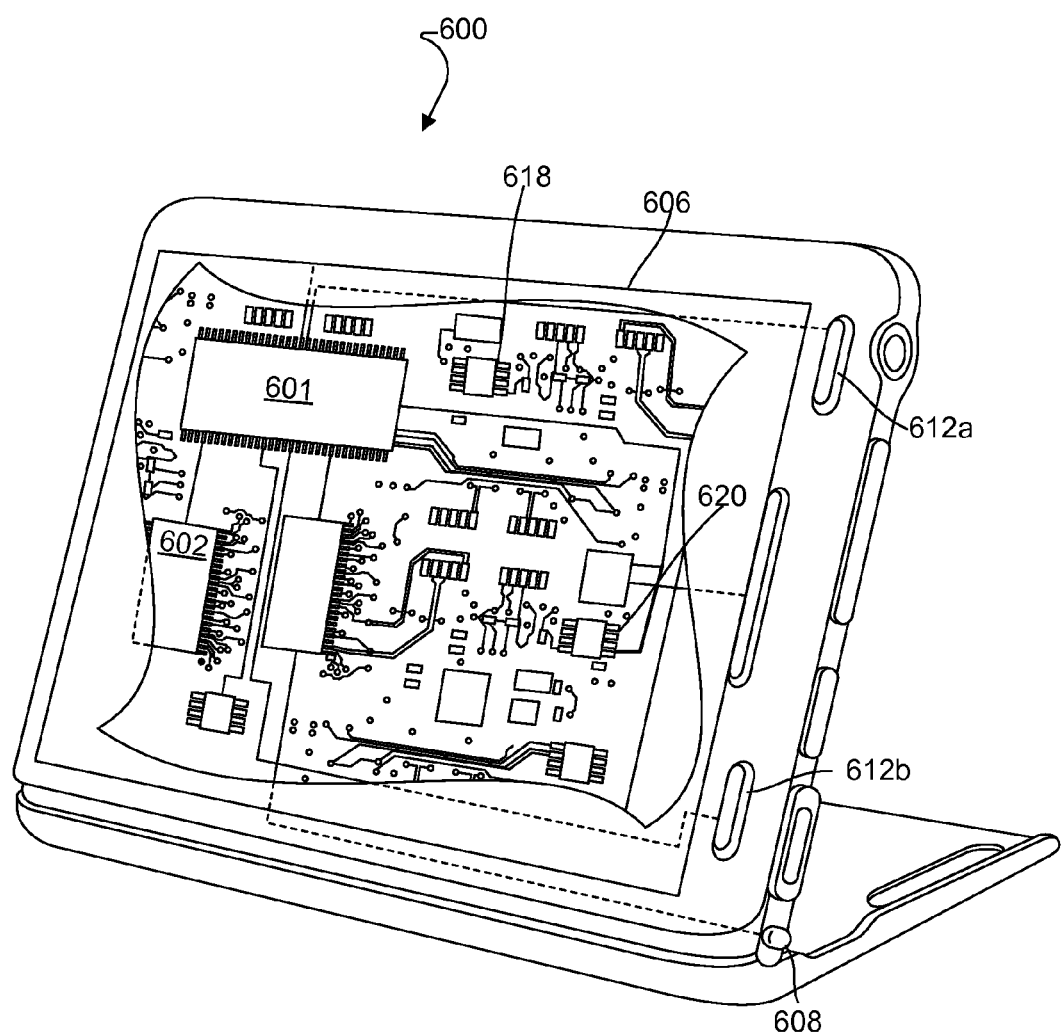
FIG. 6 is a diagram illustrating an exemplary mobile device suitable for implementation of various aspects.

The various aspects described herein may be implemented in any of a variety of mobile computing devices (e.g., smart phones, feature phones, etc.), an example of which is illustrated in FIG. 6. For example, the mobile computing device 600 may include a processor 601 coupled to internal memory 602. The internal memory 602 may be volatile or non-volatile memory, and may also be secure and/or encrypted memory, or unsecure and/or unencrypted memory, or any combination thereof. The processor 601 may also be coupled to a touch screen display 606, such as a resistive-sensing touch screen, capacitive-sensing touch screen infrared sensing touch screen, etc. However, the display of the mobile computing device 600 need not have touch screen capability. The mobile computing device 600 may have one or more short-range radio signal transceivers 618 (e.g., Peanut, Bluetooth®, Zigbee®, RF radio) and antenna 608 for sending and receiving wireless signals as described herein. The transceiver 618 and antenna 608 may be used with the above-mentioned circuitry to implement the various wireless transmission protocol stacks/interfaces. The mobile computing device 600 may include a cellular network wireless modem chip 620 that enables communication via a cellular network. The mobile computing device 600 may also include physical buttons 612a and 612b for receiving user inputs.

Figure 7:
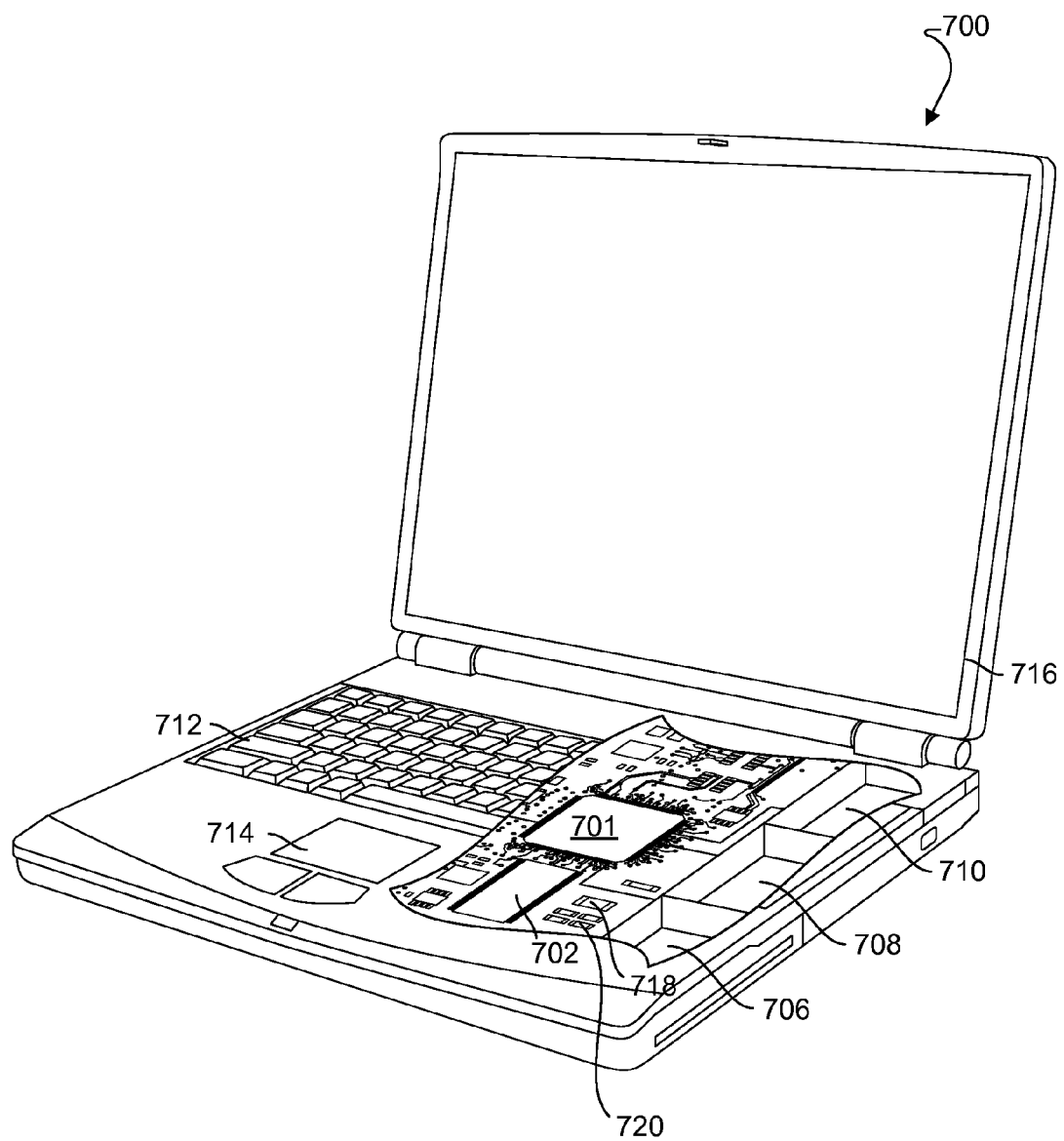
FIG. 7 is a diagram illustrating an exemplary mobile computing device suitable for implementation of various aspects.

Other forms of computing devices, including personal computers and laptop computers, may be used to implement the various aspects. Such computing devices typically include the components illustrated in FIG. 7 which illustrates an example laptop computer device 700. Many laptop computers include a touch pad touch surface 714 that serves as the computer's pointing device, and thus may receive drag, scroll, and flick gestures similar to those implemented on mobile computing devices equipped with a touch screen display and described above. Such a laptop computer 700 generally includes a processor 701 coupled to volatile internal memory 702 and a large capacity nonvolatile memory, such as a disk drive 706. The laptop computer 700 may also include a compact disc (CD) and/or DVD drive 708 coupled to the processor 701. The laptop computer device 700 may also include a number of connector ports 710 coupled to the processor 701 for establishing data connections or receiving external memory devices, such as a network connection circuit for coupling the processor 701 to a network. The laptop computer device 700 may have one or more short-range radio signal transceivers 718 (e.g., Peanut®, Bluetooth®, Zigbee®, RF radio) and antennas 720 for sending and receiving wireless signals as described herein. The transceivers 718 and antennas 720 may be used with the above-mentioned circuitry to implement the various wireless transmission protocol stacks/interfaces. In a laptop or notebook configuration, the computer housing includes the touch pad 714, the keyboard 712, and the display 716 all coupled to the processor 701. Other configurations of the computing device may include a computer mouse or trackball coupled to the processor (e.g., via a USB input) as are well known, which may also be used in conjunction with the various aspects.

The processors 601 and 701 may be any programmable microprocessor, microcomputer or multiple processor chip or chips that may be configured by software instructions (applications) to perform a variety of functions, including the functions of the various aspects described above. In the various devices, multiple processors may be provided, such as one processor dedicated to wireless communication functions and one processor dedicated to running other applications. Typically, software applications may be stored in the internal memory 602 and 702 before they are accessed and loaded into the processors 601 and 701. The processors 601 and 701 may include internal memory sufficient to store the application software instructions. In many devices the internal memory may be a volatile or nonvolatile memory, such as flash memory, or a mixture of both. For the purposes of this description, a general reference to memory refers to memory accessible by the processors 601 and 701 including internal memory or removable memory plugged into the various devices and memory within the processors 601 and 701.

The foregoing method descriptions and the process flow diagrams are provided merely as illustrative examples and are not intended to require or imply that the steps of the various aspects must be performed in the order presented. As will be appreciated by one of skill in the art the order of steps in the foregoing aspects may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the," is not to be construed as limiting the element to the singular.

The various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored on or transmitted over as one or more instructions or code on a computer-readable medium. The steps of a method or algorithm disclosed herein may be embodied in a processor-executable software module which may reside on a tangible, non-transitory computer-readable storage medium. Tangible, non-transitory computer-readable storage media may be any available media that may be accessed by a computer. By way of example, and not limitation, such non-transitory computer-readable media may comprise RAM, ROM, EEPROM, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of non-transitory computer-readable media. Additionally, the operations of a method or algorithm may reside as one or any combination or set of codes and/or instructions on a tangible, non-transitory machine readable medium and/or computer-readable medium, which may be incorporated into a computer program product.

The preceding description of the disclosed aspects is provided to enable any person skilled in the art to make or use the present invention. Various modifications to these aspects will be readily apparent to those skilled in the art, and the generic principles defined herein may be applied to other aspects without departing from the spirit or scope of the invention. Thus, the present invention is not intended to be limited to the aspects shown herein but is to be accorded the widest scope consistent with the following claims and the principles and novel features disclosed herein.

What is claimed is:

1. A method of estimating a power demand level for controlling a level of a power supply line of an active circuit, comprising:
   measuring, by a measurement circuit, a ripple amplitude and a ripple frequency on the power supply line coupled to the active circuit;
   converting, by a conversion circuit, the measured ripple amplitude and the measured ripple frequency into lookup values for comparison in a lookup table including a ripple amplitude index and a ripple frequency index, wherein the ripple amplitude index and the ripple frequency index include combinations of previously stored first values of the ripple amplitude and the ripple frequency, respectively, associated with second values of corresponding estimated power demand levels;
   determining, by a processor, an estimated power demand level of the active circuit using the lookup values in the lookup table; and
   controlling, by the processor, the level of the power supply line using the determined estimated power demand level.

2. The method according to claim 1, wherein in the lookup table the second values of corresponding estimated power demand levels are indexed to the previously stored first values of the ripple amplitude and the ripple frequency.

3. The method according to claim 2, wherein the second values of corresponding estimated power demand levels are calculated based on an intrinsic inductance of the power supply line and an intrinsic capacitance of the active circuit.

4. The method according to claim 1, further comprising using the estimated power demand level of the active circuit to identify a peak power usage condition, wherein controlling the level of the power supply line is in response to identifying the peak power usage condition before a critical thermal level is reached.

5. The method according to claim 1, wherein:
   the power supply line is associated with a digital circuit; and
   measuring the ripple amplitude and the ripple frequency on the power supply line coupled to the active circuit comprises measuring the ripple amplitude and the ripple frequency using an analog circuit with a high input impedance coupled to the power supply line.

6. The method according to claim 1, wherein the active circuit includes a system-on-chip (SoC) circuit.

7. A method of calibrating a power monitor circuit for estimating a power demand level of an active circuit on a power supply line, the method comprising:
   disabling, by a clock disable module, a clock associated with the active circuit;
   inputting, using a ripple generator, a first switching signal into a calibrated test load coupled to the power supply line, the calibrated test load having a known value, the first switching signal having a first frequency lower than an intrinsic frequency of the active circuit;
   using the power monitor circuit to measure a ripple amplitude and a ripple frequency on the power supply line associated with inputting the first switching signal; and
   calculating, by a processor, a value of an estimated power demand level corresponding to the first switching signal using an intrinsic capacitance of the active circuit and an intrinsic inductance of the power supply line; and
   storing in memory the calculated value of the estimated power demand level.

8. The method according the claim 7, further comprising the processor determining a leakage load associated with the active circuit as a function of a ratio of the intrinsic capacitance and the intrinsic inductance.

9. The method according to claim 8, further comprising:
inputting a second switching signal into the calibrated test load, the second switching signal having a second frequency lower than the first frequency;
measuring a line current in the power supply line; and
establishing the calibrated test load based on the determined leakage load.

10. The method according to claim 7, further comprising:
inputting a plurality of switching signals each having representative amplitudes and representative frequencies into the calibrated test load;
determining estimated power demand levels of the active circuit on the power supply line for each combination of the representative amplitudes and frequencies of the plurality of switching signals; and
storing in the memory the estimated power demand level for each combination of the representative amplitudes and frequencies of the plurality of switching signals.

11. The method according to claim 10, wherein storing in the memory the estimated power demand level for each combination of the representative amplitudes and frequencies of the plurality of switching signals comprises storing the estimated power demand level for each combination in a lookup table in which each estimated power demand levels is indexed to a particular combination of the representative amplitudes and frequencies.

12. A power monitor circuit configured to estimate a power demand level of an active circuit on a power supply line, the power monitor circuit comprising:
an interface having leads configured to couple the power monitor circuit to the power supply line of the active circuit;
a measurement circuit coupled to the interface, the measurement circuit comprising:
a ripple amplitude measurement section configured to measure a ripple amplitude of the power supply line when the leads are coupled to the power supply line; and
a ripple frequency measurement section configured to measure a ripple frequency of the power supply line when the leads are coupled to the power supply line;
a conversion circuit coupled to the measurement circuit, the conversion circuit comprising:
a ripple amplitude conversion section configured to convert the measured ripple amplitude into a first lookup value for comparison with a ripple amplitude index in a lookup table; and
a ripple frequency conversion section configured to convert the measured ripple frequency into a second lookup value for comparison with a ripple frequency index in the lookup table, wherein the ripple amplitude index and the ripple frequency index include combinations of previously stored first values of the ripple amplitude and the ripple frequency, respectively, associated with second values of corresponding estimated power demand levels; and
a memory coupled to the interface, the measurement circuit, and the conversion circuit, the memory storing the lookup table.

13. The power monitor circuit according to claim 12, an output circuit coupled to the memory and the conversion circuit and configured to use the ripple amplitude index and the ripple frequency index to obtain and output a corresponding estimate of power demand level from the memory.

14. The power monitor circuit according to claim 12, wherein the measurement circuit comprises an analog circuit having a high input impedance that is coupled to the interface.

15. The power monitor circuit according to claim 12, wherein the active circuit comprises a system-on-chip (SoC) circuit.

16. The power monitor circuit according to claim 12, wherein the memory stores the plurality of estimated power demand levels indexed to the ripple amplitude index and the ripple frequency index in the lookup table.

17. The power monitor circuit according to claim 12, further comprising a calibration circuit and a processor coupled to the calibration circuit, the memory, and the conversion circuit, wherein the calibration circuit comprises:
a calibrated test load having a known resistance value; and
a switch configured to connect the calibrated test load to the interface,
wherein the calibration circuit is configured to control the switch to generate a first calibration signal on the power supply line through the calibrated test load when the leads are coupled to the power supply line, the first calibration signal having a first frequency lower than an intrinsic frequency of the active circuit when a clock associated with operation of the active circuit is disabled, and
wherein the measurement circuit is further configured to:
measure a calibration ripple amplitude and a calibration ripple frequency associated with the first calibration signal through the calibrated test load; and
wherein the processor is configured to:
calculate a value of an estimated power demand level corresponding to the first calibration signal using an intrinsic capacitance of the active circuit and an intrinsic inductance of the power supply line.

18. The power monitor circuit according to claim 17, wherein the processor is further configured to determine a leakage load associated with the active circuit as a function of a ratio of the intrinsic capacitance and the intrinsic inductance.

19. The power monitor circuit according to claim 17, wherein:
the calibration circuit is further configured to control the switch to generate a second calibration signal on the power supply line through the calibrated test load, the second calibration signal having a second frequency lower than the first frequency when the clock associated with the operation of the active circuit is disabled;
the measurement circuit is further configured to:
measure a line current in the power supply line; and
the processor is further configured to:
establish the calibrated test load based on the determined leakage load.

20. The power monitor circuit according to claim 19, wherein:
the calibration circuit is further configured to control the switch to generate a plurality of ripple calibration signals on the power supply line through the calibrated test load, each of the plurality of ripple calibration signals having representative amplitudes and representative frequencies; and
the processor is further configured to determine estimated power demand levels of the active circuit on the power supply line for each combination of the representative amplitudes and the representative frequencies of the plurality of ripple calibration signals.

21. A power monitor circuit, comprising:
- means for measuring a ripple amplitude and a ripple frequency on a power supply line coupled to an active circuit;
- means for converting the measured ripple amplitude and the measured ripple frequency into lookup values for comparison in a lookup table including a ripple amplitude index and a ripple frequency index, wherein the ripple amplitude index and the ripple frequency index include combinations of previously stored first values of the ripple amplitude and the ripple frequency, respectively, associated with second values of corresponding estimated power demand levels; and
- means for determining an estimated power demand level of the active circuit using the lookup values in the lookup table; and
- means for controlling a level of the power supply line using the determined estimated power demand level.

22. The power monitor circuit according to claim 21, wherein in the lookup table the second values of corresponding estimated power demand levels are indexed to the previously stored first values of the ripple amplitude and ripple frequency.

23. The power monitor circuit according to claim 22, wherein the second values of corresponding estimated power demand levels are calculated based on an intrinsic inductance of the power supply line and an intrinsic capacitance of the active circuit.

24. The power monitor circuit according to claim 21, wherein:
- the power supply line is associated with a digital circuit; and
- means for measuring the ripple amplitude and the ripple frequency on the power supply line coupled to the active circuit comprises means for using an analog circuit with a high input impedance coupled to the power supply line.

25. The power monitor circuit according to claim 21, wherein the active circuit includes a system-on-chip (SoC) circuit.

26. The power monitor circuit according to claim 21, further comprising:
- means for disabling a clock associated with the active circuit;
- means for inputting a first switching signal into a calibrated test load coupled to the power supply line, the calibrated test load having a known value, the first switching signal having a first frequency lower than an intrinsic frequency of the active circuit;
- means for using the power monitor circuit to measure the ripple amplitude and the ripple frequency on the power supply line associated with inputting the first switching signal; and
- means for calculating a value of the estimated power demand level corresponding to the first switching signal using an intrinsic capacitance of the active circuit and an intrinsic inductance of the power supply line; and
- means for calibrating the power monitor circuit using the calculated value of the estimated power demand level.

27. The power monitor circuit according the claim 26, further comprising means for determining a leakage load associated with the active circuit as a function of a ratio of the intrinsic capacitance and the intrinsic inductance.

28. The power monitor circuit according to claim 26, further comprising:
- means for inputting a second switching signal into the calibrated test load, the second switching signal having a second frequency lower than the first frequency;
- means for measuring a line current in the power supply line; and
- means for establishing the calibrated test load based on the determined leakage load.

29. The power monitor circuit according to claim 26, further comprising:
- means for inputting a plurality of switching signals each having representative amplitudes and representative frequencies into the calibrated test load;
- means for determining estimated power demand levels of the active circuit on the power supply line for each combination of the representative amplitudes and frequencies of the plurality of switching signals; and
- means for storing the estimated power demand level for each combination of the representative amplitudes and frequencies of the plurality of switching signals.

30. The power monitor circuit according to claim 29, wherein means for storing the estimated power demand level for each combination of the representative amplitudes and frequencies of the plurality of switching signals comprises means for storing the estimated power demand level for each combination in the lookup table in which each estimated power demand levels is indexed to a particular combination of the representative amplitudes and frequencies.

* * * * *